United States Patent [19]
Kaiser

[11] Patent Number: 5,712,184
[45] Date of Patent: Jan. 27, 1998

[54] METHOD FOR MANUFACTURING INTEGRATED CIRCUITS COMPLETE WITH HIGH Q PASSIVE DEVICES

[75] Inventor: Reinhold Kaiser, Heilbronn, Germany

[73] Assignee: Temic Telefunken microelectronic GmbH, Heilbronn, Germany

[21] Appl. No.: 552,491

[22] Filed: Nov. 9, 1995

[30] Foreign Application Priority Data

Nov. 11, 1994 [DE] Germany .................. 44 40 362.3

[51] Int. Cl.⁶ .................................................. H01L 21/76
[52] U.S. Cl. ........................ 437/62; 437/89; 437/60; 437/47
[58] Field of Search ..................... 437/47, 62, 60; 148/DIG. 12, DIG. 135; 257/507, 535

[56] References Cited

U.S. PATENT DOCUMENTS

| | | | |
|---|---|---|---|
| 4,161,742 | 7/1979 | Kane | 357/48 |
| 4,292,730 | 10/1981 | Ports . | |
| 4,418,470 | 12/1983 | Naster et al. . | |
| 4,819,037 | 4/1989 | Sakakibara et al. . | |
| 5,001,075 | 3/1991 | Boland et al. . | |
| 5,047,828 | 9/1991 | Soclof | 357/55 |
| 5,071,792 | 12/1991 | VanVonno et al. . | |
| 5,145,795 | 9/1992 | Sanders et al. . | |
| 5,258,318 | 11/1993 | Buti et al. . | |
| 5,268,326 | 12/1993 | Lesk et al. . | |
| 5,521,412 | 5/1996 | Walker et al. . | |

FOREIGN PATENT DOCUMENTS

| | | |
|---|---|---|
| 60060734 | 9/1983 | European Pat. Off. . |
| 0439634 | 1/1990 | European Pat. Off. . |
| 5335529 | 12/1993 | Japan . |

OTHER PUBLICATIONS

Ohno, Terukazu et al.; "Total–Dose Effects of Gamma–Ray Irradiation on CMOS/SIMOX Devices"; *IEEE Circuits and Devices Magazine*, Nov. 1987, pp. 21–25.

Tsao, Sylvia; "Porous Silicon Techniques for SOI Structures"; and Barla, Kathy et al.; SOI Technology Using Buried Layers of Oxidized Porous Si; *IEEE Circuits and Devices Magazine*, Nov. 1987, pp. 3–7, 11–15.

*Primary Examiner*—George Fourson
*Attorney, Agent, or Firm*—Spencer & Frank

[57] ABSTRACT

A method for manufacturing integrated circuits complete with integrated low loss capacitances, inductances, and high Q resistors. Initially a large number of monocrystalline—in their lateral and vertical directions dielectrically insulated—boxes for receiving the active devices of the integrated circuit are generated on a semiconductor substrate wafer with high resistivity. A subset of the completely insulated boxes is to provide for receiving the active devices generated by appropriate bipolar, MOS, or BiCMOS technologies. The other subset is to provide for receiving the passive devices. From these boxes, the monocrystalline semiconductor material is removed completely. In the empty boxes, the walls of which boxes consist of a dielectric, thin film conductor structures are defined by deposition and lithographic processes, eventually forming the passive devices. Due to the layer combination of thin film conductor/dielectric/substrate with high resistivity, the passive devices manufactured in these boxes will be marked by very low losses only, i.e. they are possessed of a high quality (Q).

15 Claims, 1 Drawing Sheet

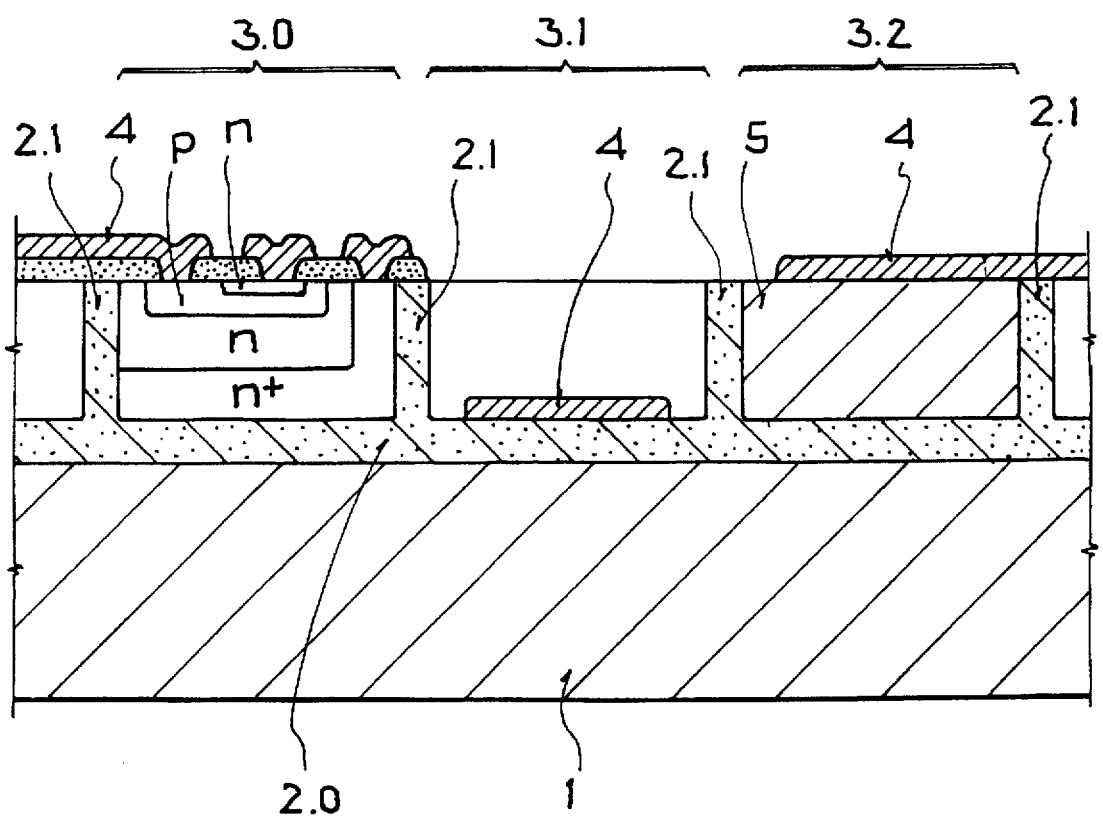

METHOD FOR MANUFACTURING INTEGRATED CIRCUITS COMPLETE WITH HIGH Q PASSIVE DEVICES

BACKGROUND OF THE INVENTION

This invention concerns a method for manufacturing integrated circuits complete with integrated low loss capacitances, inductances, and high Q resistors.

For integrated circuits operated at high frequencies, e.g. within the UHF band, low loss passive devices—inductances, capacitances, and resistors (integrated poly-resistors)—are of particular significance. If these passive devices are integrated, it is principally their quality (Q) which suffers, i.e. losses at high frequency will increase substantially. This is due to the fact that there are further conductive zones between the passive devices and the substrate, and that in most cases even the substrate is possessed of a high conductivity.

SUMMARY OF THE INVENTION

This invention therefore provides a method for manufacturing integrated circuits allowing the integration of low loss passive devices. This task is achieved by a method for manufacturing integrated UHF circuits complete with integrated low loss (high Q) passive devices, including the following sequential process steps: providing a semiconductor substrate wafer with high resistivity; generating or forming monocrystalline semiconductor material in lateral and vertical direction dielectrically insulated boxes for receiving the active devices of the integrated circuit; removing the monocrystalline material from those boxes provided for receiving the passive devices; and, forming appropriate thin film conductor structures by deposition and structuring inside the empty boxes provided for the passive devices in order to form the passive devices. Further advantageous applications and features of this method are described.

For the method described herein, first a large number of monocrystalline—in their lateral and vertical directions dielectrically insulated—boxes for receiving the active devices of the integrated circuit will be generated on a semiconductor substrate wafer with high resistivity. Suitable methods are provided by the silicon on insulator (SOI) technologies. The following are particularly suitable: the SIMOX technology featuring separation by implanted oxygen, the BESOI technology featuring silicon layers insulated by means of wafer bonding, and the FIPOS technology featuring complete insulation by means of oxidated porous silicon. This latter technology, for instance, has been described in "IEEE Circuits and Devices Magazine", November 1987, pages 3–7 and pages 11–15.

A subset of the completely insulated boxes is to provide for receiving the active devices generated by the relevant bipolar, MOS, or BiCMOS technologies. The other subset is to provide for receiving the passive devices. From these boxes, the monocrystalline semiconductor material will be removed completely. In the empty boxes, the walls of which boxes consist of a dielectric material, thin film conductor structures will be defined by means of conductive layer deposition and a structuring of these layers using lithographic processes. These thin film conductors will then finally form the passive devices. Due to the layer combination of thin film conductor/dielectric/substrate with high resistivity, the passive devices manufactured in these boxes will be marked by very low losses only, i.e., they are possessed of a high quality (Q).

Preferably, the resistivity of the substrate wafer is higher than 1 kΩcm, and, for passive devices of a particularly high quality, higher than 5 kΩcm.

The thin film conductor structures of the passive devices will be formed from aluminum, gold, copper, or alloys of these metals, as well as poly-silicon or a metal silicide. In particular, titanium or tantal disilicide will be suitable for use as metal silicides.

Preferably, the semiconductor material of the substrate wafer and monocrystalline boxes will be silicon. For maximum frequency applications, silicon-germanium must also be considered.

In another application of this method, the boxes provided for receiving the passive devices will be filled with a dielectric such that the configuration will have an even surface. Known planarisation methods will be suitable here, for instance. The thin film conductor structures of the passive devices will then be generated on the surface of the dielectric above the filled-in empty box.

The passive devices manufactured in this way will be inductances, capacitances and (poly-) resistors. The method described above will be preferably used for manufacturing integrated UHF circuits.

BRIEF DESCRIPTION OF THE FIGURE

FIG. 1 shows a cross-section through an integrated circuit complete with active and passive devices.

DESCRIPTION OF THE PREFERRED EMBODIMENTS

A silicon substrate wafer 1 with high resistivity will first be processed, using known process stages, until a large number of monocrystalline silicon islands 3.0, 3.1, 3.2 has been generated on its surface, which silicon islands will be insulated from the substrate wafer by means of a dielectric layer 2.0, and from each other by means of vertical dielectric material, zones 2.1 extending from the surface down to the dielectric layer 2.0. These boxes 3.0, 3.1, 3.2 will be surrounded on all sides—surface excepted—by the dielectric material, and thus completely insulated.

In a subset of the boxes 3.0, the active devices of the integrated circuit will be formed. In FIG. 1, a bipolar transistor complete with its corresponding terminal metallisation is shown. However, it is a matter of course that other active devices such as MOS transistors, diodes, etc. can also be formed.

In another subset of the boxes 3.1, 3.2, the passive devices of the integrated circuit will be generated; these are to be characterized by particularly low loss properties. To this end, the semiconductor material will be removed completely from the box such that only the dielectric 2.0, 2.1—forming floor and walls of the box—will remain. In the first instance, the thin film conductor structures 4 of the passive device will be formed on the floor surface of box 3.1. In the second instance, box 3.2 will first be filled-in by means of a further dielectric 5; then the thin film conductor structures 4 will be formed on the surface above the filled-in box. This second instance does have the advantage that no measures for rounding or tapering box edges will need to be taken. In both instances, the thin film conductor structures will be masked by means of a photolithographic process stage, and then etched, in order to generate the relevant structures. This can be done in a common process stage together with the first metallisation level of the active devices. It is also possible, however, to generate the passive devices in a separate process or together with any existing further metallisation level. Also, all process-technologically meaningful combinations from several metallisation levels and separate processes are conceivable for passive device generation.

For metallisation, normal materials used as standard in semiconductor technology will be suitable, in particular poly-silicon—doped and non-doped—for manufacturing low loss resistors; aluminum, gold, copper, or alloys of these metals, and metal silicides—here, in particular, titanium silicide and tantal silicide—, for manufacturing capacitances and inductances. For manufacturing the resistors, resistor metals such as e.g. CrNi, known from hybrid technology, will also be suitable. These will be applied to the dielectric by means of the known sputter process, and then structured by means of suitable methods.

The above-described method will be particularly suitable for manufacturing integrated UHF circuits featuring low loss inductances and capacitances.

What is claimed is:

1. Method for manufacturing integrated circuits complete with integrated passive devices, using the following sequential process steps:

providing a semiconductor substrate wafer with a resistivity greater than approximately 5 k$\Omega$cm;

generating monocrystalline semiconductor material in lateral and vertical direction dielectrically insulated boxes for receiving the active devices of the integrated circuit, with the boxes being disposed on a surface of the semiconductor wafer;

removing the monocrystalline material from boxes provided for receiving the passive devices; and, forming appropriate thin film conductor structures by deposition and structuring inside the empty boxes provided for receiving the passive devices.

2. Method according to claim 1 wherein the resistivity of the substrate wafer is higher than 5 k$\Omega$cm.

3. Method according to claim 1 wherein the thin film conductor structures of the passive devices consist of poly-silicon.

4. Method according to claim 1 wherein the thin film conductor structures of the passive devices consist either of aluminum, gold, copper, or alloys of these metals.

5. Method according to claim 1 wherein the thin film conductor structures of the passive devices consist of a metal silicide.

6. Method according to claim 5 wherein the metal silicide is selected from a group comprised of titanium silicide and tantal silicide.

7. Method according to claim 1 wherein the semiconductor material is silicon or silicon-germanium.

8. Method for manufacturing integrated UHF circuits complete with integrated passive devices, using the following sequential process steps:

providing a semiconductor substrate wafer with a resistivity greater than approximately 5 k$\Omega$cm;

generating monocrystalline semiconductor material in lateral and vertical direction dielectrically insulated boxes for receiving the active devices of the integrated circuit, with the boxes being disposed on a surface of the semiconductor wafer;

removing the monocrystalline material from the boxes provided for receiving the passive devices;

filling the empty boxes with a dielectric material using a planarisation process; and, forming appropriate thin film conductor structures by deposition and structuring in the boxes provided for receiving the passive devices, with the deposition of appropriate thin film conductor structures forming the passive devices being done on the surface of the dielectric filling the respective empty box.

9. Method according to claim 1 wherein the passive devices are selected from the group made up of inductors, capacitors, and (poly-) resistors.

10. Method according to claim 9, wherein the thin film conductor structures of the resistors are formed by resistor metals.

11. Method according to claim 10, wherein the resistor metal is CrNi.

12. Method for manufacturing integrated UHF circuits complete with integrated passive devices, using the following sequential process steps:

providing a semiconductor substrate wafer with a resistivity greater than approximately 5 k$\Omega$cm;

providing a dielectric layer on the surface of the substrate;

forming a plurality of vertically and laterally dielectrically insulated boxes in the surface of the dielectric layer;

generating monocrystalline semiconductor material in the dielectrically insulated boxes for receiving the active devices of the integrated circuit;

removing the monocrystalline material from boxes provided for receiving the passive devices; and, forming appropriate thin film conductor structures by deposition and structuring inside the boxes provided for receiving the passive devices to form the passive devices.

13. Method according to claim 12, wherein the appropriate thin film conductor structures are formed in the empty boxes provided for receiving the passive devices.

14. Method according to claim 12, further comprising, prior to the step of forming the appropriate thin film conductor structures, at least partially filling the boxes provided for receiving the passive devices with a dielectric material, and forming the appropriate thin film conductor structures on the surface of the dielectric material in the boxes provided for receiving the passive devices.

15. Method according to claim 14, wherein the step of at least partially filling the boxes includes completely filling the boxes provided for receiving the passive devices with a dielectric material using a planarisation process.

* * * * *